US006530147B1

(12) United States Patent
Haas et al.

(10) Patent No.: US 6,530,147 B1
(45) Date of Patent: Mar. 11, 2003

(54) MICROFIBER DIELECTRICS WHICH FACILITATE LASER VIA DRILLING

(75) Inventors: David R. Haas, Westfield, NJ (US); Chengzeng Xu, Morristown, NJ (US); Mavyn McAuliffe, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/708,131

(22) Filed: Nov. 7, 2000

Related U.S. Application Data (62) Division of application No. 09/344,038, filed on Jun. 25, 1999, now Pat. No. 6,224,965.

(51) Int. Cl.[7] .................................................. H05K 3/00
(52) U.S. Cl. .............................. 29/829; 29/830; 29/837; 216/65
(58) Field of Search ........................... 428/209; 29/829, 29/830, 835, 837, 841; 216/65

(56) References Cited

U.S. PATENT DOCUMENTS 5,768,108 A * 6/1998 Miura et al. ................. 361/792
5,888,627 A * 3/1999 Nakatani ..................... 428/209
5,965,245 A * 10/1999 Okano et al. ................ 428/209

* cited by examiner

*Primary Examiner*—Cathy Lam
(74) *Attorney, Agent, or Firm*—Rutan & Tucker, LLP; Sandra P. Thompson; Robert D. Fish

(57) ABSTRACT

This invention concerns electronic substrates comprising a non-woven filler material and a resin material. The present invention also includes electronic products manufactured from the electronic substrates of this invention including, but not limited to prepregs, metal clad laminates, and printed wiring boards with and without lased via holes. The present invention further includes a method of manufacturing printed built-up wiring boards including the steps of forming a prepreg and forming at least one via in the prepreg.

16 Claims, 7 Drawing Sheets

MICROFIBER DIELECTRICS WHICH FACILITATE LASER VIA DRILLING

This application is a divisional application of allowed U.S. application Ser. No. 09/344,038, which was filed Jun. 25, 1999 now U.S. Pat. No. 6,224,965.

BACKGROUND OF THE INVENTION

(1) Field of the Invention

This invention concerns prepregs comprising a resin impregnated non-woven micro-fiber glass reinforcing material. The present invention also includes electronic products that are manufactured using the electronic substrates of this invention including, but not limited to built-up printed wiring boards wherein the layers built-up with the prepregs of this invention include lased vias.

(2) Description of the Art

Electronic substrates based on inorganic woven reinforcing material coupled with thermosetting or thermoplastic polymers are well known as are woven glass fiber reinforced epoxy-based resin systems. Such woven fiber reinforced substrates form the foundation for conventional printed circuit board substrates. Although such substrates are excellent for conventional circuitry, they can suffer from a number of shortcomings when they are used to manufacture high density electronic circuitry. For example, it can be difficult to fabricate very thin structures (below 4 mil) using with the desired degree of uniformity using woven glass because the fabrication of continuous glass (silica) fiber becomes more difficult as the fiber diameter is reduced below about 5 microns. In addition, the ability to control the Coefficient of Thermal Expansion (CTE) of electronic substrates is limited by the properties of the woven glass fibers and by the density of glass. Thus conventional electronic circuit substrate technology becomes more difficult to apply to the fabrication of high density circuitry.

There is also a growing demand for multi-layer printed circuit boards with micro-vias uniting circuit layers. One of the leading technical approaches for manufacturing micro-vias involves using a laser to ablate holes from the outside of a circuit board, through one or more layers of insulation down to another layer of circuitry. Woven glass fabric reinforced prepregs are very difficult to laser drill as the glass is slow to ablate, and the amount of glass that needs to be ablated varies widely depending on location of the via hole in relation to the glass weave.

Resin coated foil (RCC™) has been used to fabricate high density built-up multilayer circuit boards with lased visas. However, RCC™ is both expensive, and can only be used with subtractive circuitry manufacturing methods where copper is etched to create the circuit patterns. Furthermore dielectric layer formed using RCC™ are unreinforced with little inherent strength, high CTE, and poor dimensional stability. It is difficult to use the resin coated copper products where one wishes to plate up the circuitry after ablating the via holes.

Organic fiber reinforcements are an option to woven glass reinforceable materials. However organic fiber reinforcing materials are expensive, and they can suffer from very high moisture absorption (aramid reinforcements).

Despite the advancements made in the quality of reinforced electronic substrates, there remains a need for improvements. Specifically, there remains a need for reinforced electronic substrates that cleanly ablate when lased to produce quality through holes or vias. There also remains a need for reinforced lasable electronic substrates with improved dimensional stability, and with CTE's that more closely match the circuit layer CTE.

SUMMARY OF THE INVENTION

This invention includes reinforced prepreg materials for fabricating multi-layer build-up PWBs that include laser drilled vias.

This invention also includes prepregs that have a high degree of dimensional stability and uniformity when subjected to changing environmental conditions such as temperature and humidity.

Yet another aspect of this invention are prepregs that are very thin thereby facilitating the fabrication of lased micro-vias.

Still another aspect of this invention are dielectric materials that are amenable to laser micro-via fabrication.

In still another aspect, the present invention is a dielectric material useful in the manufacture of built-up printed wiring boards having a uniform dielectric spacing.

In yet another aspect of this invention laser ablatable prepregs are made on the surface of a copper foil creating a Reinforced Resin Coated Copper (RRCC) material.

Still another aspect of this invention are methods for manufacturing built-up printed wiring boards using the dielectric materials of this invention wherein vias can be uniformly and consistently lased into the dielectric materials to facilitate multi-level circuit fabrication.

The present invention includes lasable prepregs for use in the fabrication of build-up multilayer printed wiring boards. The prepregs comprise a non-woven reinforcing material consisting primarily of micro-fiber glass and a partially cured polymer.

The present invention further includes methods for manufacturing a RRCC material wherein a coating of resin is applied first to a copper foil, the reinforcement is laid onto the resin coated copper foil and the combined reinforced resin coated foil is then passed through a heater where the resin is partially cured.

The present invention also includes methods for manufacturing multiple layer electronic circuits that include a plurality of lased vias. The method includes applying a prepreg having a first surface and a second surface and comprising a non-woven reinforcing material consisting primarily of micro-fiber glass impregnated with a partially cured polymer to a substrate consisting of at least one layer of circuitry located on the surface of the substrate such that the prepreg first contacts the layer of circuitry to give a partially cured laminate. The partially cured laminate is then cured at elevated temperatures and pressures for a period of time sufficient to fully cure the partially cured laminate. Finally, a plurality of vias are formed in the cured laminate by lasing.

DESCRIPTION OF THE CURRENT EMBODIMENT

The present invention relates to electronic substrates comprising a non-woven micro-fiber glass reinforcing material and a polymer material that are useful in the manufacture of built-up multi-layer wiring boards (BUM's) that include laser drilled micro-vias. Another aspect of the invention are BUM's made using the laser drillable electronic substrates.

One aspect of this invention are prepregs manufactured using a non-woven reinforcement made from micro-fiber glass. The prepregs of this invention are made with micro-fibers with diameters that are about five to ten times smaller than are present in woven glass fabric. Micro-fiber glass reinforcement results in prepregs that are spatially uniform. The spatial uniformity and small diameter make the prepregs amendable to laser ablation.

The prepregs of this invention may be used to make micro-via containing built-up multi-layer (BUM) printed circuit boards. The prepregs are pressed with or without copper foil onto a core laminate containing at least one and typically two or more layers of copper circuitry produced by standard printed circuit board manufacturing techniques. Thus according to an aspect of this invention an inexpensive built-up dielectric layer of this invention that is easily laser ablatable is added onto a core circuit board and may be used in both additive and subtractive circuit manufacturing processes to add additional circuitry layers to each successive built-up layer. This layering process may be repeated using the created circuitry as a new core and adding additional built-up layers including prepregs of this invention to obtain additional circuitry layers.

The term "micro-fiber glass" is used herein to refer to glass fibers having a nominal diameters of less than about 2 microns and preferably, less than about 1 micron. The non-woven micro-fiber glass is preferably "essentially all" micro-fiber glass meaning that at least about 80% of the micro-fiber glass should have the prescribed diameters.

The prepregs of this invention can optionally include a non-woven reinforcing material other than micro-fiber glass. The reinforcing material may include micro-fiber glass alone, or in combination with any fibrous material. Examples of useful fibrous materials include glass, polymer, ceramic, silica, organics such as liquid crystal polymer (LCP) fibers, natural fibers, polymer fibers, and mixtures thereof.

The optional fibrous reinforcing materials should be easily laser ablatable. Preferred supplemental fibrous reinforcing materials include organic polymer staple fibers or pulp. These additional reinforcing materials should be added only in small amounts as needed to achieve desired prepreg properties such as tear strength, process-ability, better CTE control, etc.

The prepregs of this invention should include an amount of reinforcing material sufficient to give good CTE and good dimensional stability while still allowing sufficient flow of the polymer when the prepreg is pressed onto circuitry layers. The polymer in the prepreg must flow around the circuit lines and completely fill the spaces between circuit lines to create a solid, void-less laminate after cure. This generally means that the prepregs of this invention should include from about 5 to about 60 wt % reinforcing material and from about 40 to about 95 wt % polymer, and most preferably from about 15 to about 50 wt % reinforcing material and from about 50 to about 85 wt % polymer.

The glass micro-fiber reinforcing material may be any type of non-woven glass micro-fiber material. The term "glass" as used herein to refers to silica containing fibers including E-glass, B-glass, D-glass, M-glass, and mixtures thereof. The glass micro-fibers are typically formed into a sheet and wound into a roll. Useful non-woven glass micro-fiberous materials include, but are not limited to, AAAAA-100, AAAA-102, AAA-104, and AA-108 micro-fiberous glass manufactured by Johns Manville and 608M and 700B micro-fiberous glass manufactured by Evanite.

The non-woven micro-fiber glass containing fabric can be made without a binder, but is preferentially made with a resin binder which is a low moisture absorbing resin that increases the tear strength of the fabric and improves the ease with which the fabric can be handled for impregnation and prepreging. Commonly used resin binders include epoxy-vinyl acetate binders, aqueous dispersions of epoxies, etc. The optional binders should be present in an amount sufficient to provide improved handling of the fabric during manufacture of the fabric and prepreg may be present in an amount ranging from about 0.1 to about 20 wt.% and most preferably from about 5.0 to about 15 wt. % based upon the reinforcing material weight.

Prepregs of this invention are made using non-woven micro-fiber glass which has been formed into a non-woven fabric material consisting primarily of micro-fiber glass using known processes for making wet-laid fabric (paper-making process). The fibers used to make the non-woven fabric contains glass micro-fibers (diameter less than 2 microns, and preferentially less than 1 micron). It is preferred that the reinforcing material comprises "primarily" non-woven glass micro-fibers meaning that the reinforcing materials should include at least 50 wt % micro-fiber glass. Most preferably the reinforcing material includes greater than 75% by weight of micro-fiber glass with any remainder being supplemental reinforcing materials.

The micro-fiber glass containing reinforcing material may include a coupling agent which facilitates adhesion of the reinforcing material to the polymer. Any coupling agent commonly used in the art that bonds to the reinforcing material and that facilitates polymer bonding to the reinforcing material may be used. Preferred coupling agents are silane based coupling agents. Examples of useful silane based coupling agents include CS718 manufactured by Clark Schwebel, Inc. Other examples of useful silane based coupling agents include CS767 and CS440, both manufactured by Clark-Schwebel. If used, the coupling agent is typically applied to the reinforcing material prior to resin impregnation. The coupling agent should be present on the reinforcing material in an amount sufficient to coat essentially all of the reinforcing material fibers. This usually corresponds to an amount of coupling agent ranging from about 0.05 to about 3.0 wt %, and more preferably from about 0.125 to about 1.5 wt % coupling agent based upon the reinforcing material weight.

Prepregs of this invention are manufactured by impregnating the chosen reinforcing material with an appropriate polymer. The polymer will typically consist of at least one polymer as well as any other materials known in the art as being useful in electronic substrates that provide the desired strength, durability, heat resistance, water resistance and so forth, to the materials manufactured from the resin. Some examples of resin additives include, chain extenders, curing agents, catalysts, reactivity controllers, dyes, and so forth. Resin compositions useful in this invention consist of any combination of thermoplastic or thermoset resins such as, but not limited to epoxy, cyanate ester, silicone, polyamide, bismaleimide triazine, or urethane resin systems. Other examples of resin systems useful in manufacturing electronic substrates are described in U.S. Pat. Nos. 5,508,328, 5,620,789, 5,534,565 and U.S. Provisional Application Serial No. 60/019,853 each of which are incorporated herein by reference. Another resin system example is set forth in PCT/EP97/05308 which is also incorporated herein by reference. Other useful resin systems include thermosetting polymer resin systems such as epoxy resin systems, thermoplastic resin systems such as cycloaliphatic resins based upon polynorbomene, benzocyclobutane, polyindane-epoxy and mixtures thereof, further useful resins include high temperature engineering thermoplastic polymers such as polyether ether ketone (PEEK), polyphenylene sulfur (PPS), thermoplastic polyimides, ULTEM®, indane epoxy, and mixtures thereof.

The thickness of the prepregs can be controlled by adjusting the resin content or the reinforcing material fabric thickness. The prepreg thickness can vary depending upon its end use. The prepreg thickness may range from about 0.25 to about 18 mils and preferably from about 0.5 to about 4.0 mils. The thickness of prepregs that will include lased micro-vias should be at least 0.5 mils without a metal layer and preferably at least about 6.0 to about 12 mils without a metal layer. To provide a uniform electrical substrate having a preferred thickness of from about 2.0 to about 8.0 mils, the electronic substrate is manufactured in sheet form and includes from about 10 to about 80 wt % a resin.

The non-woven micro-fiber glass fabric is manufactured into a prepreg by impregnating the non-woven fabric with a resin and, if the resin chosen is thermosetting resin, thereafter partially curing the substrate. The resin impregnated reinforcing material is preferably b-staged; cured to a degree sufficient to achieve the desired amount of flow upon subsequent use of the prepreg in laminating process in the manufacture of a circuit board while making a PWB. This impregnation and partial curing (treating) steps are preferentially performed in a roll to roll process such as is currently used for manufacture of PWB prepreg based on woven glass fabric. The degree of cure of the resin is typically between 10% and 50%. The amount of resin and the degree of cure are adjusted to give the desired flow of resin depending upon the prepreg end use. There should be enough resin in the prepreg to allow the resin to flow and cover the circuitry traces when it is pressed onto the inner core layers of the PWB. If the resin used is a thermoplastic, not a thermoset, it can be pressed onto the fabric from one or preferentially both sides using a heated platen or belt press.

The prepregs of this invention can be used to make additive layers of circuitry with laser drilled micro-vias on top of a fabricated printed circuit board by pressing the prepreg with or without copper foil onto the fabricated printed circuit board. Thus this invention includes prepregs and dielectric layers that are inexpensive, laser ablatable, and usable in a large variety of both additive and subtractive circuitry processing techniques. The electronic dielectric prepreg layers of this invention are especially useful for making laser-drilled micro-via containing circuit boards.

Figure 1:
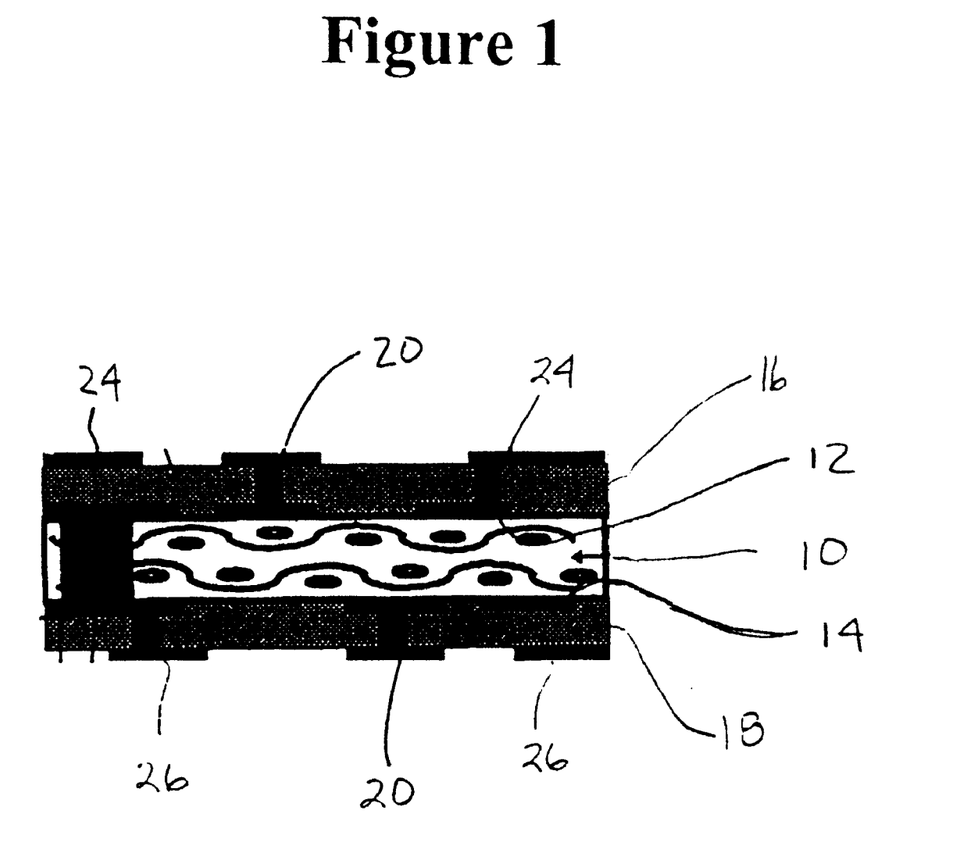
FIG. 1 is a side cut-away view of a multilayer printed wiring board including micro-vias.

The prepregs of this invention including micro-fiber glass reinforcement are useful for manufacturing micro-via containing PWBs using standard additive and substrate techniques. Referring to FIG. 1, core 10 including two circuit layers 12 and 14 are used as the starting point for building circuit layers using the prepregs of this invention. In one embodiment, a prepreg 16 and 18 of this invention, are placed on circuit layers 12 and 14 of core 10. Each prepreg 16 and 18 is then covered by a conductive metal foil such as copper foil and the stack of material is pressed under pressure and temperature to fully cure the polymer in the prepreg. Typical conditions are temperature between 160° C. and 250° C. and pressures between 100 and 500 psi.

There should be enough flow of polymer during prepreg curing step to completely cover the patterned circuitry layers 12 and 14 on the core of the board. If the resin is a thermoplastic then heat and pressure are applied to melt and laminate the materials together and pressure may be substantially reduced.

Once the laminate is prepared, micro-vias may be drilled into the laminate using a laser. The micro-vias may be formed in the laminate either before or after circuits are formed on the laminate surface. In one method, holes are made in the metal foils where one desires micro-vias (connections between circuitry layers). These holes are produced using standard lithography and etching techniques for copper foil used in the PWB industry. After holes in the copper foil are made, the cured prepreg material underneath the hole is "drilled" by ablation with a laser, typically a $CO_2$ or frequency-tripled Nd:yag or an excimer laser. Alternately, these holes can be created with a laser if it is capable of ablating the metal foil.

After lasing the micro-via holes, a chemical or plasma treatment may be used clean the micro-vias. A common technique is to dip the circuit board into a permanganate etch bath. If the laser produces clean via holes this step may be skipped. After cleaning the vias, any of the standard techniques used in the industry for electroless and then electroplating via holes can be used to create micro-vias 20 that conductively unite adjacent circuit layers. Alternatively, a conductive material such as conductive paste or inks can be placed in the vias to conductively unite circuit layer. The conductive metal foil may then patterned creating two new outer circuitry layers 24 and 26 again using standard industry techniques. At this point the process can be repeated as many times as desired to create more build-up layers on the PWB or, if enough layers have been made, the board may be finished.

Alternatively an additive process may be used to manufacture sequential built-up circuit layers using the prepregs of this invention. In the additive process, the prepreg is laminated to a core containing one or more exposed circuits in order to produce a laminate including an exposed dielectric layer prepared by fully curing the prepreg layer of this invention. Next, a thin conductive metal layer is applied to the surface of the dielectric layer by sputtering or by any other technique known for applying a thin conductive metal layer to a substrate. The micro-vias may be laser drilled into the dielectric layer either before or after the sputtering step. If the micro-vias are drilled before the sputtering step, the sputtering will also be useful in applying a very thin layer of conductive metal onto interior walls of the micro-vias. Once the sputtering step is complete, a resist layer is applied to cover the sputtered metal surface and developed in order to expose the sputtered metal portions where circuit lines are desired and to protect the sputtered metal surface when no circuit lines are desired. Next, a conductive metal layer is built-up on the exposed sputtered metal surface in order to give circuit lines. During the build up step, the conductive metal also fills the micro-vias and connects one or more circuit layers in the core to the circuit being built up. Once the circuit build-up is complete, the protective resist layer is removed to expose the protected portion of the sputtered metal and the exposed sputtered metal is removed from the surface of the dielectric layer by etching.

The lased vias may be any size via used in electronic substrates. It is preferred, however, that the vias are micro-vias having the diameter of from about less than about 0.5 to about 8 mils and preferably from about 0.5 to about 6 mils. In addition, the lased vias preferably do not penetrate through the entire laminate. Instead, the lased vias will typically link two adjacent circuit layers. However, the lased vias may link nonadjacent circuit layers where the nonadjacent circuit layers are applied to either the outer most core surface or to the surface of built-up dielectric layers prepared using the prepregs of this invention.

The laseable dielectric layers formed from the prepregs of this invention can be lased in a plurality of locations using uniform laser settings without producing unacceptable thermally damaged vias. Preferably, the lasable dielectrics of this invention can be lased with a laser set at consistent settings such that at least 80% of the lased vias and preferably 95% or more of the lased are acceptable, i.e., the vias do not exhibit unacceptable thermal damage. Unacceptable thermal damage can manifest itself in several symptoms. Flow of the resin away from the via exposing greater than 5 microns of the reinforcement is one such symptom. Another symptom is charred or blackened resin extending more than two or three microns from the edge of the via hole. A further symptom observed is melting or discoloration of the resin along a fiber of the reinforcement for distances from 2 microns to 25 or 50 microns away from the hole.

Figure 2:
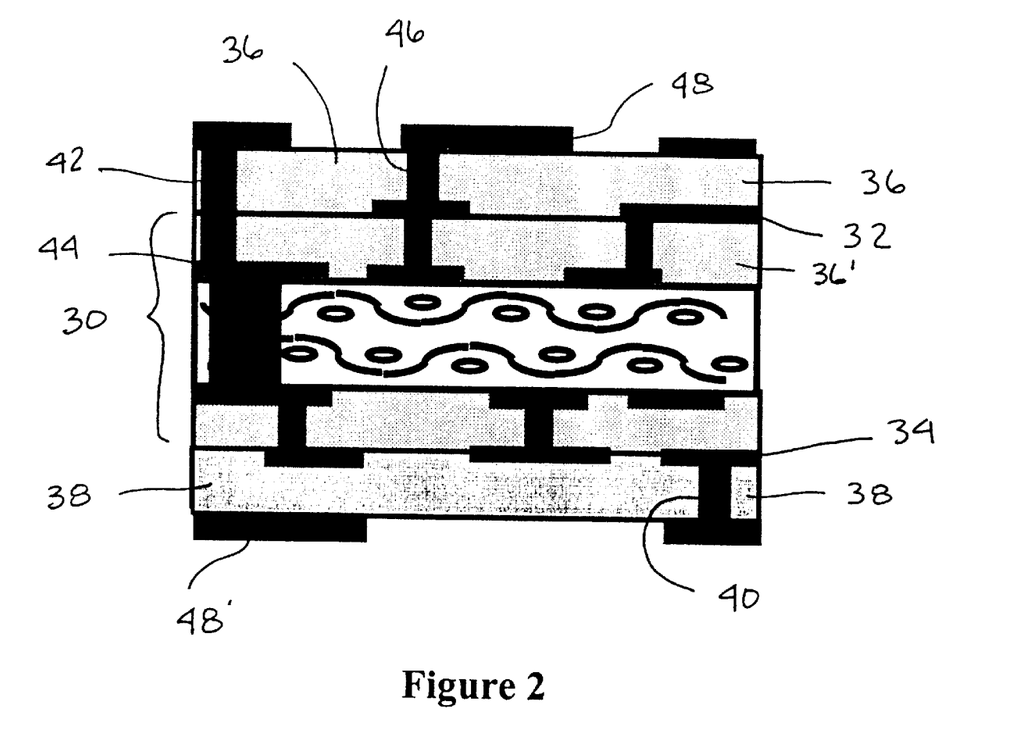
FIG. 2 is a side cut-away view of a built-up multilayer wiring board including lased vias that connect circuit layers.

In another embodiment, shown in FIG. 2, a core 30 of the construction described for FIG. 1, consisting of two circuit layers on a standard PWB material with a layer of built up circuitry on either side is used as the starting point for creating another set of build-up layers. Prepregs 36 and 38 of this invention, are placed on circuit layers 32 and 34 of core 30. Each prepreg 36 and 38 is then covered by a conductive metal foil such as copper foil and the stack of material is pressed under pressure and temperature to filly cure the polymer in prepregs 36 and 38. Typical curing conditions include temperatures between 160° C. and 250° C. and pressures between about 100 and 500 psi. There should be enough flow of polymer during prepreg curing step to completely cover the patterned circuitry layers 32 and 34 on the core of the board. If the resin is a thermoplastic, then heat and pressure are applied to melt and laminate the materials together and pressure may be substantially reduced.

Once the laminate is prepared, micro-vias may be drilled into the laminate using a laser. The micro-vias may extend down one layer as via 40 extends down to the circuit layer which was the first built-up layer 34. Micro-vias such as micro-via 42 may also extend through cured prepregs 36 and 36' in the first built-up layer circuitry down to circuitry layer 44 that is beneath adjacent circuitry layer 32. Micro-vias such as micro-via 46 may also extend through the outer lasable cured prepreg 36 and connect multiple circuitry layers 32 and 44 that are part of core 30 at the top of lasable cured prepreg layer 36. Via 46 is commonly called a stacked via. The vias can be filled with conductive material and the outer circuitry layers defined by techniques standard to the printed circuitry industry.

The present invention includes methods for manufacturing a RRCC. A roll of copper foil is coated with a resin solution with a liquid coater such as a slot-die coater or a reverse gravure coater. A second roll of non-woven reinforcing material is unwound and laid into the wet resin on the copper foil and the reinforcing material and becomes saturated with the resin. The reinforcement, resin and copper are then passed through an oven where the solvent is evaporated, and the resin cured to between 10% and 50% creating a Reinforced Resin Coated Copper prepreg. It is preferred that the copper foil is coated with an amount of resin that exceeds the amount necessary to saturate the reinforcing material so that the final RRCC product has a first surface rich in resin that is opposite the copper foil surface.

The present invention further includes methods for manufacturing a multiple layer electronic circuit with a RRCC material that includes a plurality of lased vias. The RRCC used preferably comprises a non-woven reinforcing material consisting primarily of micro-fiber glass impregnated with a partially cured resin that is located between a first surface rich in a resin and a second surface of copper. The method includes applying a RRCC, with the resin rich surface down onto a substrate consisting of at least one layer of circuitry located on the surface of the substrate to form a partially cured laminate. Curing the partially cured laminate, and then forming vias in laminate surface either before or after the copper layer is removed from the laminate.

EXAMPLE 1

A non-woven micro-fiber glass fabric is made using standard industry practice for making a wet-laid fabric (paper-making process). In this process a slurry of fibers is deposited onto a moving screen (forming wire) where the fibers collect as an entangled sheet and are dried off resulting in a fabric. The fibers in the slurry used to make this fabric contain predominantly micro-fiber glass from Evanite Corporation. This fabric is impregnated with a solution of cyanate esters, which contains methyl ethyl ketone (60 parts by weight), Ciba Arocy B-10 (40 parts by weight) and manganese octoate (100 ppm Mn), and dried at 90° C. for 5 minutes in an oven to obtain a prepreg containing about 70% by weight of resin.

The prepreg is laminated to a printed wiring board and cured in a press at 170° C. for 3 hours under 350 psi pressure. The prepreg layer looks uniform in glass fiber distribution under SEM. Microvia holes of 1–6 mils in diameter in the prepreg layer are drilled with both ultraviolet and $CO_2$ lasers. For the fully cured prepreg layer, the glass transition temperature is 230° C. and moisture uptake at saturation in conditions of 85° C. and 85% relative humidity is about 12%.

EXAMPLE 2

A non-woven micro-fiber glass fabric is made using standard industry practice for making a wet-laid fabric (paper-making process). The pulp used to make this fabric contains silica micro-fibers with diameter less than 2 microns. This fabric is impregnated with a solution of epoxy resin, which contains Dow Chemical XUR-1544-55284-24 epoxy mixture (200 parts by weight), elf Autochem SMA EF-30 styrene maleic anhydride (150 parts by weight), N,N'-dimethylformamide (150 parts by weight), and 2-ethyl-4-methyl imidazole (EMI, 0.15 part by weight), and dried and partially cured at 165° C. for 3 minutes in an oven to obtain a prepreg containing about 70% by weight of resin.

The prepreg is laminated to a printed wiring board and cured in a press at 200° C. for 90 minutes. The cured dielectric layer looked uniform in glass fiber distribution under SEM. Acceptable microvia holes of 1–6 mils were drilled in the dielectric layer with both ultraviolet and $CO_2$ lasers. For the fully cured prepreg layer, the glass transition temperature is 180° C. and moisture uptake at saturation about 0.5%.

EXAMPLE 3

This example demonstrates the advantage of the micro-fiber non-woven glass reinforcement over woven glass reinforcement for lasing applications. A resin mixture is prepared as follows: 378.20 grams of the Dow epoxy resin DER 592-A80 is weighed and placed in a mixing beaker. Next, 92.50 grams of DMF solvent is added and the mixture covered and stirred with an air-driven mixer. After the resin has dissolved completely, 17.45 grams of Shell epoxy resin EPON-1031-A70 is added and the mixture is again covered and stirred until all the resin has dissolved. Lastly, 1.20 grams of Boric Acid, 1.05 grams of 2-methylimidazoled and 9.4 grams of Dicy are added. The mixture is covered and stirred until it is uniform. This basic resin mixture is firther diluted with PMA in the ratio: 24 grams of resin solution to 8.0 grams of PMA.

A non-woven micro-fiber glass fabric obtained from Hollingsworth & Vose Corporation, type BMG03310 is used. This is a fabric made entirely from M-glass micro fibers of nominal diameter 0.8 microns. A sample is cut into a 13 inch by 12-inch sheet. The fabric weight is about 3.7 grams for the 12-inch by 13-inch piece. Two thin strips of copper about 0.032 inches thick and 12 inches long by one half inch wide are placed such that they sandwich about ¼ to ½ inch of one edge of the fabric. They span from one 12-inch long side to the other along one edge. Thus the remaining uncovered area of the fabric is at least 12 inches wide by 12 inches long. The fabric is clamped between the copper strips using three small binder clips.

A sheet of FEP (fluorinated ethylene propylene) film is placed onto a flat surface. The fabric, clamped between the copper, is laid onto the FEP film with the clipped edge furthest away from the person making the sample. A #12 Meyer rod purchased from Gardner & Co is placed on the fabric adjacent to the copper strips. A thin blotting paper is placed on the FEP film, just below the non-woven fabric such that it can absorb any excess resin after the Meyer rod is drawn across the fabric sheet. The resin formulated above is poured from a small container onto the fabric creating a small bead of liquid resin solution pooled in front of, and touching the Meyer rod. The Meyer rod is slowly rolled down the film, toward the person making the sample, pushing the bead of resin forward and filling the non-woven fabric with resin. The Meyer rod is moved slowly enough that the resin pool wets the fabric as the rod is drawn across it. As the resin is absorbed into the non-woven sheet, additional resin is poured onto the fabric to maintain a small pool of resin in front of the rod. As the Meyer rod reaches the end of the fabric sheet it pushes the excess resin off the end of the sheet and into the blotter paper.

The non-woven sheet, impregnated with the resin and solvent, is picked up using the copper strips and clips and hung in a convection oven set to a temperature of 171° C. The wet fabric is hung in the oven for 2.5 minutes. During the 2.5-minute bake the solvent is evaporated off, and the epoxy resin is partially cured (b-staged). The sheet is removed from the oven. The clips are opened and the copper strips peeled back from the sheet. This constitutes the nonwoven micro-fiber glass reinforced prepreg (NW-PP). The NW-PP is trimmed to 12 inches by 12 inches and weighed again. The total weight is now about 9.66 grams corresponding to a resin content of about 65%.

A similar process is used to make a woven glass prepreg with a layer of woven glass replacing the non-woven fabric. Type 101 woven glass fabric from Clark Schwebel is used. This fabric is the lightest weight woven glass fabric available. The individual fiber diameters are between 5.0 and 6.0 microns. These fibers are arranged n bundles or yams which are woven together to make the fabric. Hence the individual glass fibers are much larger than the micro-fibers used in the NW-PP. In addition the fibers are distributed very non-uniformly in the fabric. The resin concentration is again adjusted to produce a sample with 50% to 70% resin after drying and partially advancing the prepreg. This sample is referred to the WG-PP for woven glass prepreg below.

EXAMPLE 4

In this Example, the prepregs prepared in Example 3 were evaluated in a laser drilling test. In-use these prepregs will be pressed onto patterned circuit boards. The resins will then be fully cured. A laser was used to burn holes for vias (electrical connections through the layer.) The cured prepreg were lased with and without copper foil covering. Generally the copper foil made it easier to lase the holes because it acts as a heat conductor reducing the propensity for thermal damage in the region closest to the holes.

This example describes a simulation of a process where the holes are lased into cured prepreg materials that have no copper foil on them. The prepregs are pressed between copper release films at elevated temperature to fully cure them. The shiny, or smooth, side of the copper foil is placed facing in to the prepreg. The stack of copper-prepreg-copper is placed between ⅛ inch thick stainless steel plates. Thin cardboard layers are placed above and below the stack of plates, copper and prepreg. The stack is now placed into the opening of a hot press preheated to 180° F. The press is closed applying 450 pounds per square inch of pressure against the stack. The temperature is raised to 350° F. and the sample is pressed at that temperature for 1.5 hours. After 1.5 hours, the heat is turned off and the prepreg is allowed to cool down to room temperature. The sample is then removed from the press.

Figure 3:
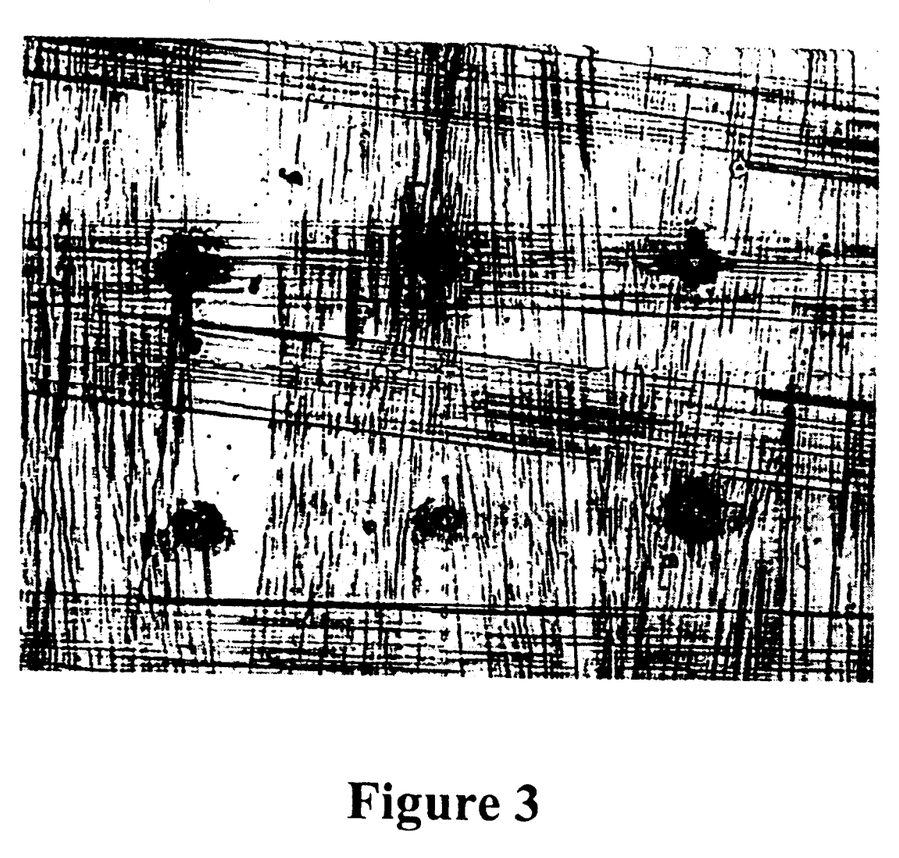
FIG. 3 is a photograph of a dielectric substrate of the prior art manufactured from woven glass reinforcing material wherein the substrate includes a plurality of laser vias many of which include unacceptable thermally damaged micro-vias.
Figure 4:
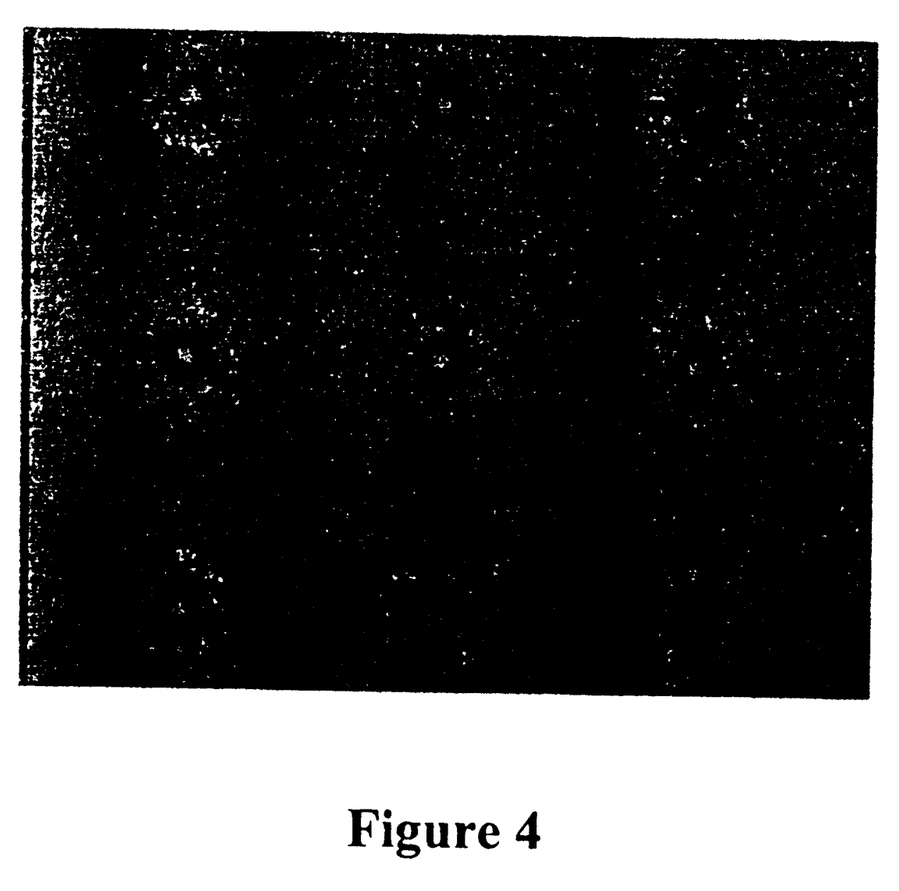
FIG. 4 is a dielectric layer of this invention that includes micro-vias lased according to Example 5 using 80 pulses at a frequency of 8 KHZ.
Figure 5:
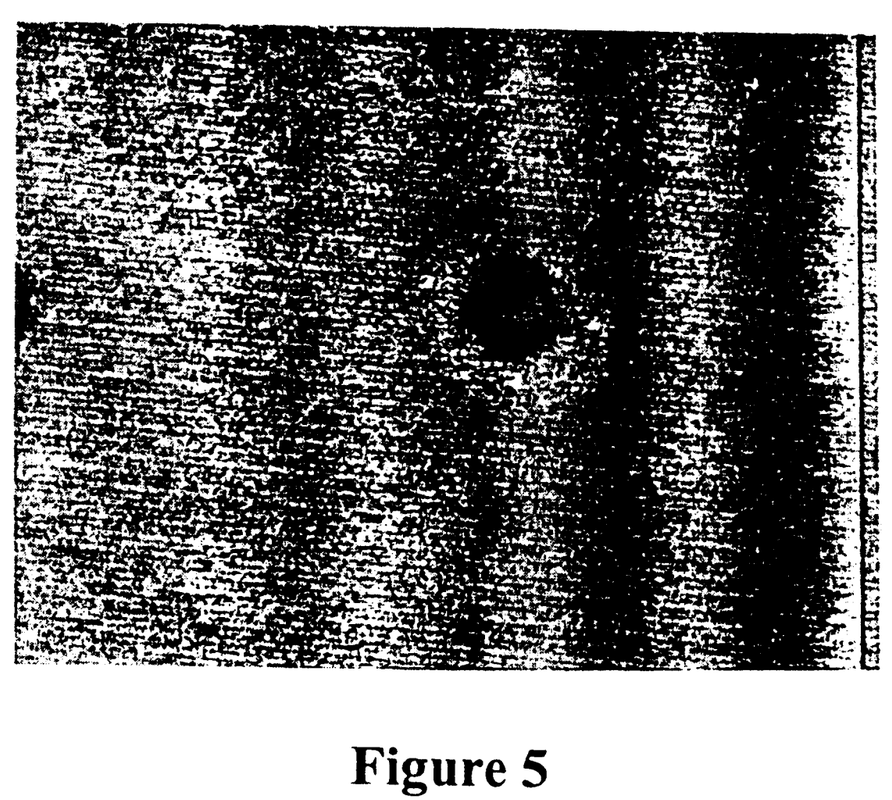
FIG. 5 is a dielectric layer of this invention that includes micro-vias lased according to Example 5 using 35 pulses at 6 KHZ.
Figure 6:
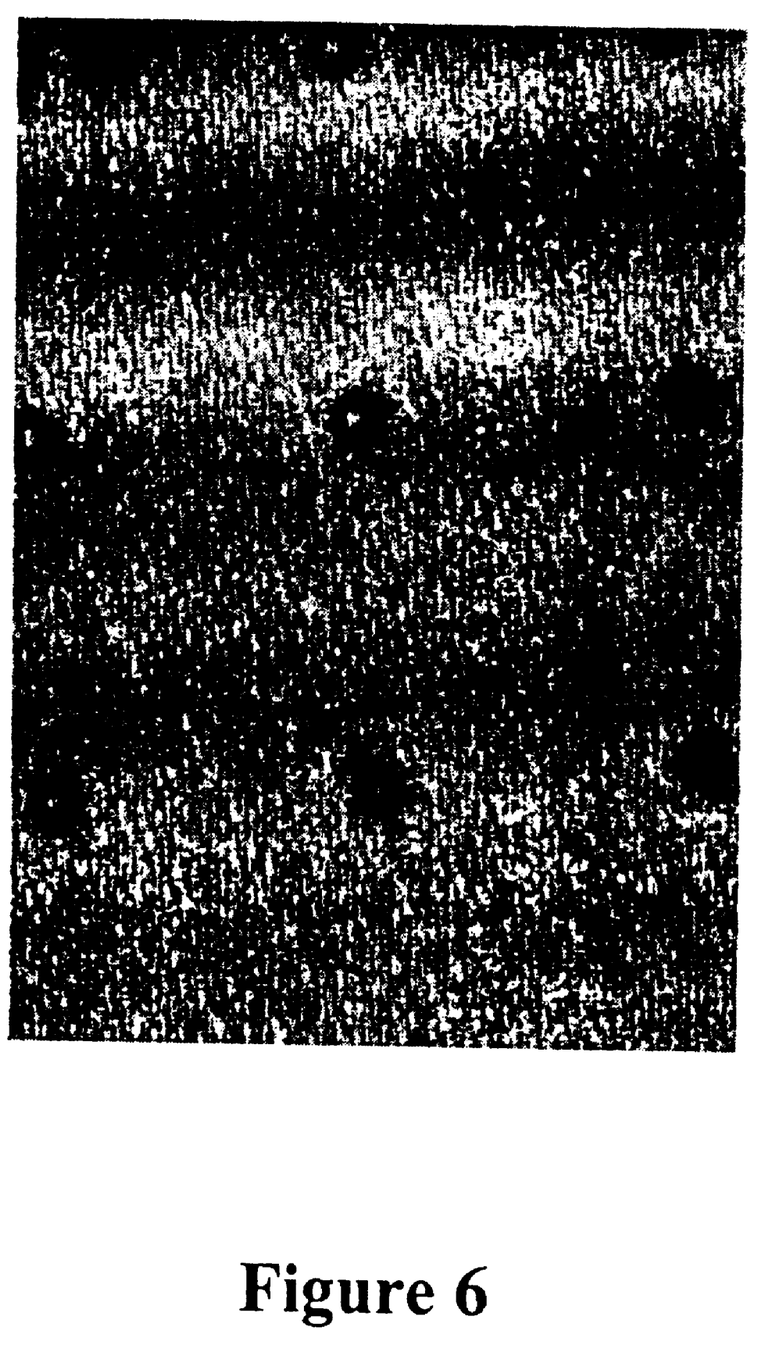
FIG. 6 is a dielectric layer of this invention that includes micro-vias lased according to Example 4 using 40 pulses at 8 KHZ.
Figure 7:
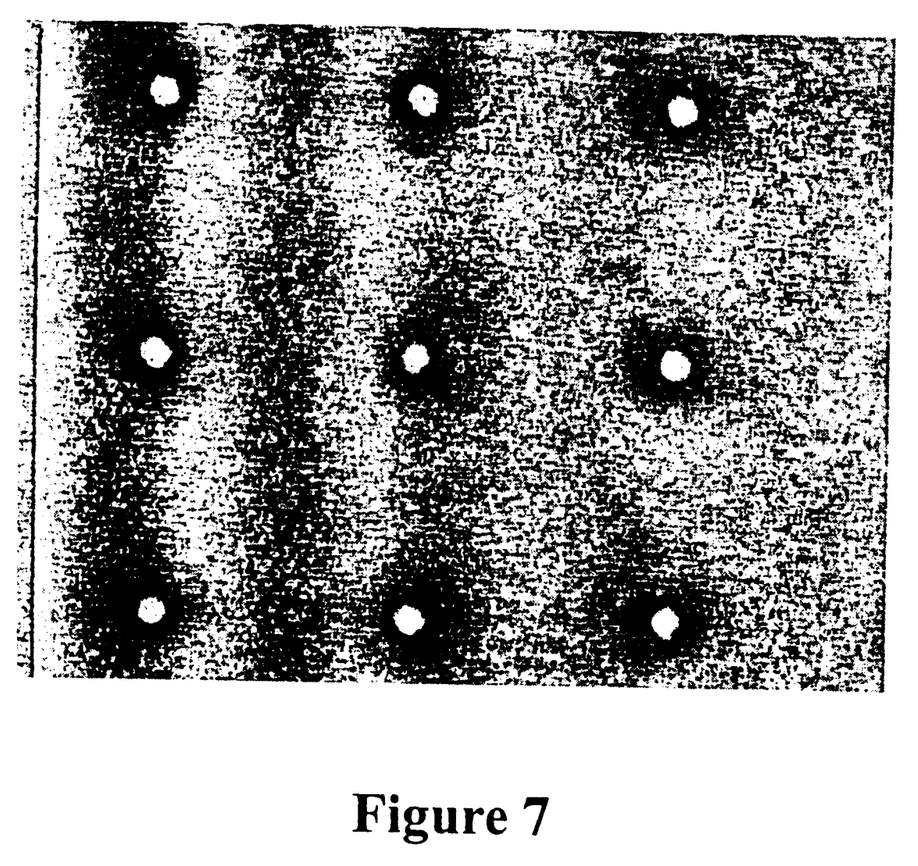
FIG. 7 is a dielectric layer of this invention that includes micro-vias lased according to Example 5 using 45 pulses at 4 KHZ.

An Nd:yag laser system from ESI Inc. designed for lasing vias in printed circuit boards with light of wavelength 355 nm is adjusted to drill an array of 144 holes. The laser can be set to put a series of pulses on the same spot to create a hole, or it can be programmed to move the laser beam in a pattern to drill out a hole. For making small (1 mil diameter) holes quickly it is preferred to set the laser to use a series of pulses directed at the same spot. With that constraint the repetition frequency of the laser can be adjusted between 2 KHz and 20 KHz. The number of pulses used to make each hole can also be set. The time average output power of the laser is set to 570 mWatts. A series of arrays of 144 holes is made. Each array of 144 holes is made at one setting for the repetition frequency and the number of pulses per hole. These parameters are varied from array to array. When finished the arrays were viewed through a microscope to determine the optimum parameters for drilling the material. No set of parameters gave an entire good array of holes in the WG-PP. Setting the parameters so that enough energy is deposited to drill holes through the regions where the yarns in the woven glass cross each other (knuckles) resulted in substantial thermal damage to the resin in those regions as illustrated in FIG. 3. If the laser parameters were set to reduce the thermal damage to an acceptable level the laser did not create wide enough holes through the glass knuckles. By contrast, a wide range of settings produced 144 very nice holes through the cured NW-PP material as shown in FIGS. 4–7. This Example illustrates the substantially improved lasability of the micro-fiber non-woven glass reinforced materials of this invention.

What we claim is:

1. A method of manufacturing a reinforced resin coated copper prepreg comprising:
   a. coating resin onto a copper foil surface;
   b. applying a reinforcing material comprising micro-fiber glass into the resin coating on the copper foil; and
   c. drying the solvent out of the resin and advancing the cure of the resin to between 10% and 50% of full cure.

2. A method for manufacturing a multiple layer electronic circuit that includes a plurality of lased vias comprising the steps of:
   (a) applying a prepreg having a first surface and a second surface and comprising a non-woven reinforcing material consisting primarily of micro-fiber glass impregnated with a partially cured polymer to a substrate consisting of a first layer of circuitry located on the surface of the substrate such that the first surface of the prepreg is in contact with the first layer of circuitry;
   (b) exposing the prepreg to elevated temperatures and pressure for a period of time sufficient to fully cure the partially cured prepreg polymer to give a laminate including a dielectric surface layer; and
   (c) lasing a plurality of micro-vias into the dielectric surface layer.

3. The method of claim 2 wherein a conductive material is applied to the via.

4. The method of claim 2 wherein a conductive metal foil layer is applied to the prepreg second surface prior to step (b).

5. The method of claim 4 wherein the lased vias include vias that extend from the conductive metal foil layer to the first layer of circuitry.

6. The method of claim 4 wherein a second circuit pattern is created on the conductive metal foil layer.

7. The method of claim 4 wherein the micro-vias are formed by laser drilling holes through both the conductive metal foil layer and the dielectric surface layer.

8. The method of claim 2 wherein the substrate includes an embedded circuitry layers that is separated from the first circuitry layer by a dielectric layer wherein at least one of the lased vias extends from the dielectric surface layer to the embedded circuitry layer.

9. The method of claim 2 wherein a plurality of holes are formed in the conductive metal foil layer prior to laser via formation and wherein the micro-vias are lased in the exposed holes.

10. The method of claim 2 wherein at least 95% of the plurality of micro-vias comprise an acceptable measure of thermal damage.

11. The method of claim 9 wherein a circuit is formed on or from the metal foil layer covering the dielectric surface layer following the lasing of at least one micro-via.

12. The method of claim 6 wherein the circuit is formed on or from the metal foil layer before the lasing of at least one micro-via.

13. The method of claim 2 wherein the laminate is processed by the further steps of:
   (i) applying a layer of sputtered metal onto the dielectric surface layer and into the micro-vias oft he laminate to give a sputtered metal surface;
   (ii) applying a resist layer to the sputtered metal surface, imaging the resist layer to define wanted and unwanted resist layer portions, and removing the unwanted resist layer portions to expose at least a portion of the sputtered metal surface and at least one micro-via;
   (iii) electroplating the metal layer to fill the exposed micro-vias with electroplated metal, and to build-up a second circuit layer corresponding to the exposed sputtered metal surface;
   (iv) removing the wanted portion of the resist layer; and
   (v) removing the sputtered metal layer below the removed wanted portion of the resist layer.

14. The method of claim 2 wherein the dielectric surface layer includes from about 5 to about 45 wt % non-woven micro-fiber glass and from about 55 to about 95 wt % polymner.

15. The method of claim 13 wherein 80% of the micro-fiber glass has a diameter less than about 1 micron.

16. The method of claim 2 wherein each micro-via is lased using a laser with a uniform power setting.

* * * * *